United States Patent
Dreiza et al.

(10) Patent No.: US 9,346,668 B1
(45) Date of Patent: *May 24, 2016

(54) MOLDED CAVITY SUBSTRATE MEMS PACKAGE FABRICATION METHOD AND STRUCTURE

(71) Applicant: Amkor Technology, Inc., Tempe, AZ (US)

(72) Inventors: Mahmoud Dreiza, Haute-Savoie (FR); Andrew Ballantine, Ain (FR); Russell Scott Shumway, Mesa, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/710,361

(22) Filed: May 12, 2015

Related U.S. Application Data

(63) Continuation of application No. 13/272,096, filed on Oct. 12, 2011, now Pat. No. 9,029,962.

(51) Int. Cl.
| | |
|---|---|
| *H01L 27/04* | (2006.01) |
| *H01L 21/00* | (2006.01) |
| *B81B 7/00* | (2006.01) |
| *B81C 1/00* | (2006.01) |

(52) U.S. Cl.
CPC .............. *B81B 7/007* (2013.01); *B81C 1/00301* (2013.01); *B81B 2207/07* (2013.01); *B81B 2207/095* (2013.01)

(58) Field of Classification Search
CPC ....... H01L 27/04; H01L 21/00; G01P 15/125; G01P 15/0802; B81B 2203/0118
USPC .......................................................... 257/415
See application file for complete search history.

(56) References Cited

U.S. PATENT DOCUMENTS 9,029,962 B1 * 5/2015 Dreiza .................... H01L 27/04
257/416

* cited by examiner

*Primary Examiner* — Monica D Harrison
(74) *Attorney, Agent, or Firm* — McAndrews, Held & Malloy

(57) ABSTRACT

Methods and systems for a molded cavity substrate Micro Electro Mechanical Systems (MEMS) package may comprise a MEMS electronic component, a base substrate comprising a first conductive through via, a molded ring coupled to the base substrate, and a lid substrate comprising dielectric material and a metal layer. The molded ring comprises a second conductive through via and a molded cavity, and the MEMS electronic component is located within the molded cavity. The base substrate may comprise a laminate substrate. The lid substrate may comprise a cavity port. A base assembly mounting adhesive may couple an inner surface of the lid to a principal surface of the molded ring. The dielectric material may comprise mold material. The molded ring may comprise mold compound adherent to an outer region of an inner surface of the base substrate with a central region of the base substrate exposed by the molded ring.

20 Claims, 6 Drawing Sheets

MOLDED CAVITY SUBSTRATE MEMS PACKAGE FABRICATION METHOD AND STRUCTURE

CROSS-REFERENCE TO RELATED APPLICATIONS

This application is a continuation of application Ser. No. 13/272,096 filed on Oct. 12, 2011, which is hereby incorporated herein by reference in its entirety.

TECHNICAL FIELD

The present application relates to the field of electronics, and more particularly, to methods of forming electronic component packages and related structures.

BACKGROUND

A Micro Electro Mechanical Systems (MEMS) package includes a MEMS sensor die, sometimes called a MEMS electronic component or transducer. As the MEMS sensor die receives external mechanical stimulus such as motion, sound waves or pneumatic pressure, the variations in the stimulus signals are converted to electrical signals.

The MEMS sensor die is located within a cavity of the MEMS package. However, forming the cavity of the MEMS package is relatively complex thus increasing the fabrication cost of the MEMS package.

BRIEF DESCRIPTION OF THE DRAWINGS

In the following description, the same or similar elements are labeled with the same or similar reference numbers.

DETAILED DESCRIPTION

Figure 1:
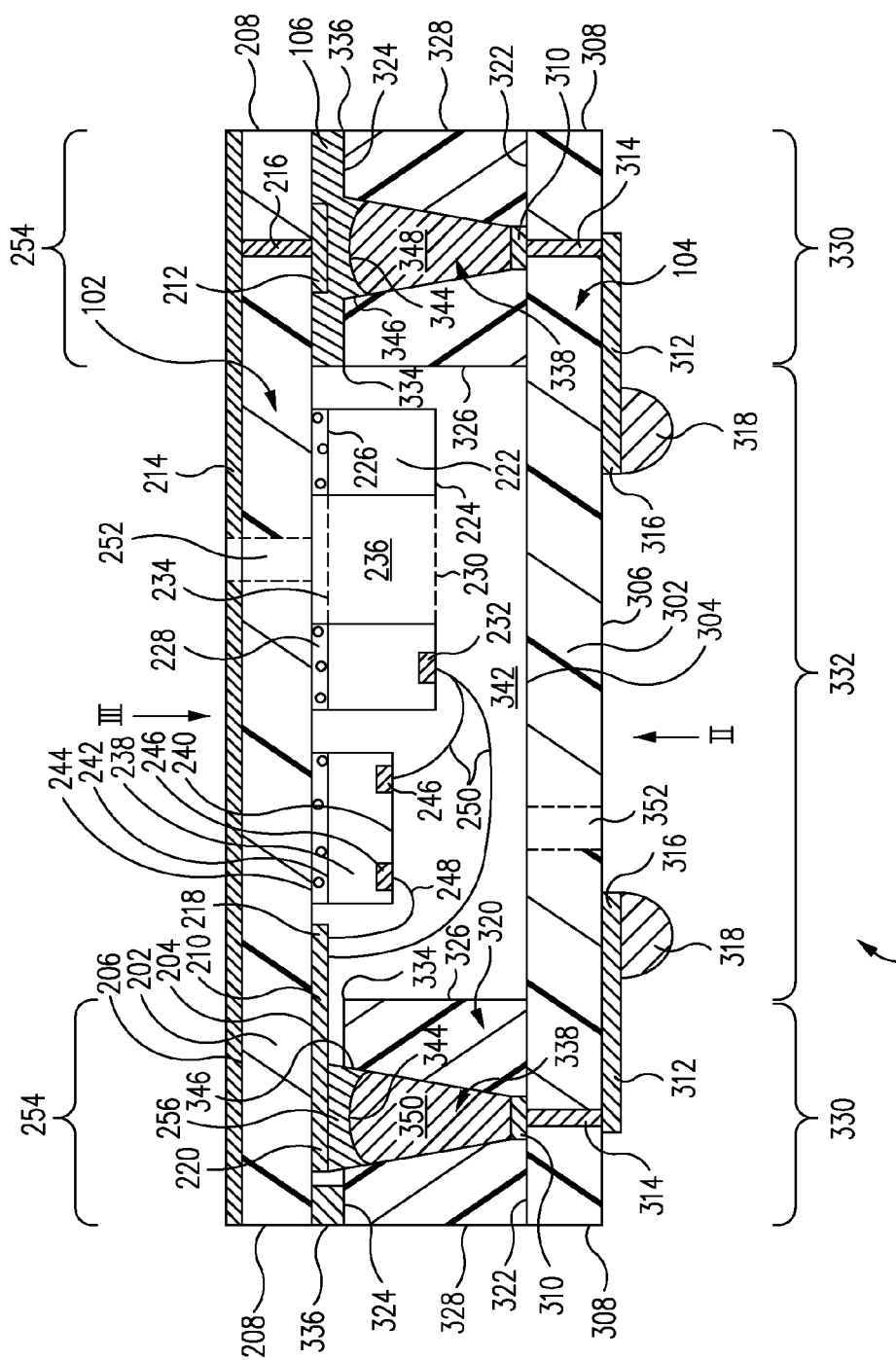
FIG. 1 is a cross-sectional view of a molded cavity substrate Micro Electro Mechanical Systems (MEMS) package in accordance with one embodiment.

As an overview and in accordance with one embodiment, referring to FIG. 1, a molded ring 320 includes a molded cavity 342 of a molded cavity substrate MEMS package 100. Molded ring 320 is formed by molding a dielectric material directly upon a substrate 302. As molding is a relatively simple and low cost process, molded ring 320 and thus molded cavity 342 are formed at a minimal cost. This, in turn, minimizes the cost of molded cavity substrate MEMS package 100.

Now in more detail, FIG. 1 is a cross-sectional view of a molded cavity substrate Micro Electro Mechanical Systems (MEMS) package 100 in accordance with one embodiment. Molded cavity substrate MEMS package 100 includes a base assembly 102 and a molded cavity substrate 104 joined together by a base assembly mounting adhesive 106.

Figure 2:
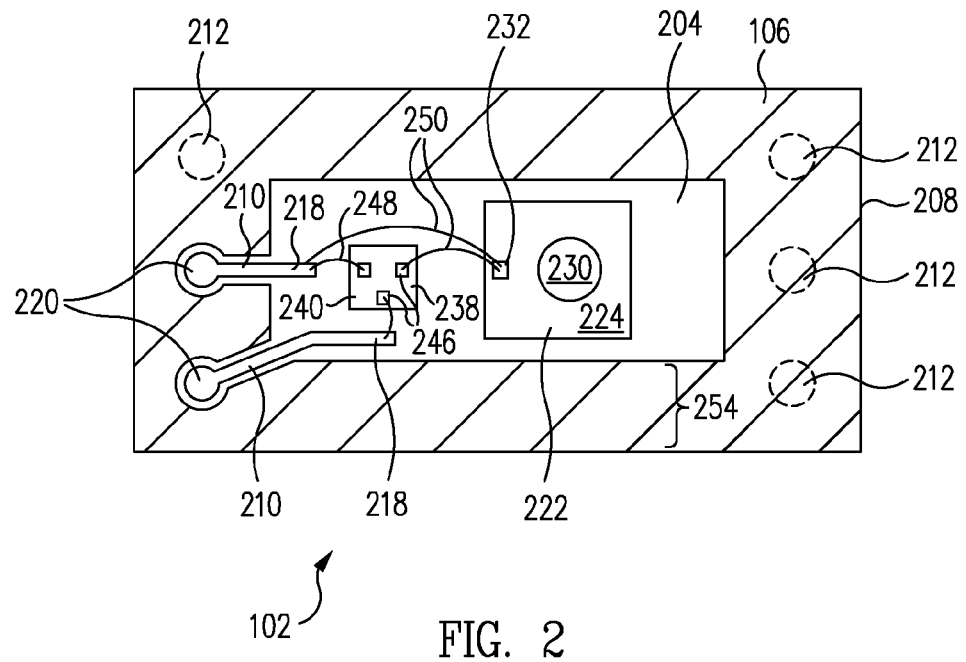
FIG. 2 is a bottom plan view taken from the direction of arrow II in FIG. 1 of a base assembly of the molded cavity substrate MEMS package in accordance with one embodiment.

FIG. 2 is a bottom plan view taken from the direction of arrow II in FIG. 1 of base assembly 102 of molded cavity substrate MEMS package 100 in accordance with one embodiment. Referring now to FIGS. 1 and 2 together, base assembly 102 includes a substrate 202.

Substrate 202 includes a dielectric material such as laminate, ceramic, printed circuit board material, or other dielectric material. Substrate 202 includes an inner surface 204, an opposite outer surface 206, and sides 208.

Substrate 202 further includes inner, e.g., first, traces 210 and ground terminals 212 formed at inner surface 204. Although two inner traces 210 and four ground terminals 212 are illustrated in FIG. 2, in light of this disclosure, those of skill in the art will understand that molded cavity substrate MEMS package 100 is formed with one or more inner traces 210 and one or more ground terminals 212 depending upon the particular input/output (I/O) required.

Further, substrate 202 includes an electrically conductive ground plane 214 at outer surface 206. Ground terminals 212 are electrically connected to ground plane 214 by electrically conductive vias 216 extending through substrate 202 between inner surface 204 and outer surface 206.

Substrate 202 can further include an inner, e.g., first, solder mask at inner surface 204 that protects first portions of inner traces 210 while exposing second portions, e.g., bond fingers 218 and MEMS terminals 220, of inner traces 210 and exposing ground terminals 212.

Although a particular electrically conductive pathway is described above, other electrically conductive pathways can be formed. For example, contact metallizations can be formed between the various electrical conductors.

Further, instead of straight though vias 216, in one embodiment, substrate 202 is a multilayer substrate and a plurality of vias and/or internal traces form the electrical interconnection between ground terminals 212 and ground plane 214.

Base assembly 102 further includes a MEMS electronic component 222. MEMS electronic component 222 is a conventional MEMS electronic component, sometimes called a MEMS chip. Accordingly, the features and functions of MEMS electronic component 222 are well known to those of skill in the art. Thus, only a general description of various features and functions of MEMS electronic component 222 are set forth below. Generally, MEMS electronic component 222 includes a mechanical element(s) that produce an electrical signal(s) from external excitations.

For purposes of illustration, MEMS electronic component 222 will be illustrated and described as an acoustical microphone, e.g., a silicon microphone, although can be another type of MEMS electronic component such as a pressure sensor, an optical sensor, a gyroscope, an accelerometer, a stress sensitive non-sensor device, or other MEMS electronic component as discussed further below.

In accordance with this embodiment, MEMS electronic component 222 includes a frontside surface 224 and an opposite backside surface 226. Backside surface 226 is mounted to inner surface 204 of substrate 202 with an adhesive 228.

MEMS electronic component 222 further includes a moveable compliant diaphragm 230 and one or more bond pads 232 formed at frontside surface 224. MEMS electronic component 222 further includes a rigid perforated backplate 234 at backside surface 226.

MEMS electronic component 222 further includes an aperture 236 extending through MEMS electronic component 222 and between frontside surface 224 and backside surface 226. More particularly, aperture 236 extends between and separates diaphragm 230 and backplate 234 such that diaphragm 230 and backplate 234 form a capacitor.

As described further below, during operation, sound waves (or pressure waves in other embodiments) move diaphragm 230 thus causing changes in the capacitance between diaphragm 230 and backplate 234. An electrical signal corresponding to the capacitance variations is output on bond pads 232.

Base assembly 102 further includes a converter electronic component 238. Converter electronic component 238 is a conventional converter electronic component, sometimes called an Application Specific Integrated Circuit (ASIC) chip. Accordingly, the features and functions of converter electronic component 238 are well known to those of skill in the art. Thus, only a general description of various features and functions of converter electronic component 238 are set forth below. Generally, converter electronic component 238 converts the signals(s) from MEMS electronic component 222 as required for the particular application.

Converter electronic component 238 includes a frontside, e.g., active, surface 240 and an opposite backside, e.g., inactive, surface 242. Backside surface 242 is mounted to inner surface 204 of substrate 202 with an adhesive 244. Frontside surface 240 includes bond pads 246.

Bond pads 246 of converter electronic component 238 are electrically connected to respective bond fingers 218 of inner traces 210 with electrically conductive bond wires 248.

In accordance with another embodiment, converter electronic component 238 is mounted in a flip chip configuration. Illustratively, flip chip bumps, e.g., solder, forms the physical and electrical interconnection between bond pads 246 of converter electronic component 238 and bond fingers 218 of inner traces 210. Optionally, an underfill is applied between converter electronic component 238 and substrate 202.

In accordance with yet another embodiment, molded cavity substrate MEMS package 100 is formed without converter electronic component 238. Illustratively, the functionality of converter electronic component 238 is incorporated into MEMS electronic component 222. Accordingly, a separate converter electronic component 238 is unnecessary and not provided.

Bond pads 232 of MEMS electronic component 222 are electrically connected to respective bond fingers 218 of inner traces 210 with electrically conductive bond wires 250. Optionally, one or more of bond pads 232 of MEMS electronic component 222 are electrically connected to respective one or more bond pads 246 of converter electronic component 238 with bond wires 250.

Accordingly, bond pads 232 of MEMS electronic component 222 are electrically connected to respective bond fingers 218 of inner traces 210, to respective bond pads 246 of converter electronic component 238, or to both respective bond fingers 218 of inner traces 210 and respective bond pads 246 of converter electronic component 238. Generally, bond pads 232 of MEMS electronic component 222 are electrically connected to respective bond fingers 218 of inner traces 210 either directly by bond wires 250 or indirectly through converter electronic component 238.

Substrate 202 further includes a base assembly port 252. Base assembly port 252 is an aperture, sometimes called an opening or hole, extending through substrate 202 between outer surface 206 and inner surface 204 including through ground plane 214. Base assembly port 252 extends through substrate 202 to backplate 234 and generally to aperture 236 of MEMS electronic component 222.

Base assembly port 252 is in fluid communication with aperture 236 of MEMS electronic component 222 and thus with diaphragm 230 of MEMS electronic component 222. As used herein, regions are in fluid communication when they are directly connected to one another without an intervening structure such that fluid, e.g., air, and sound can freely move from one region to the other.

Accordingly, during use, sound travels through base assembly port 252, passes through backplate 234, through aperture 236 and moves diaphragm 230. As described above, the motion of diaphragm 230 from the sound is converted into an electrical signal that is output on bond pads 232.

Figure 3:
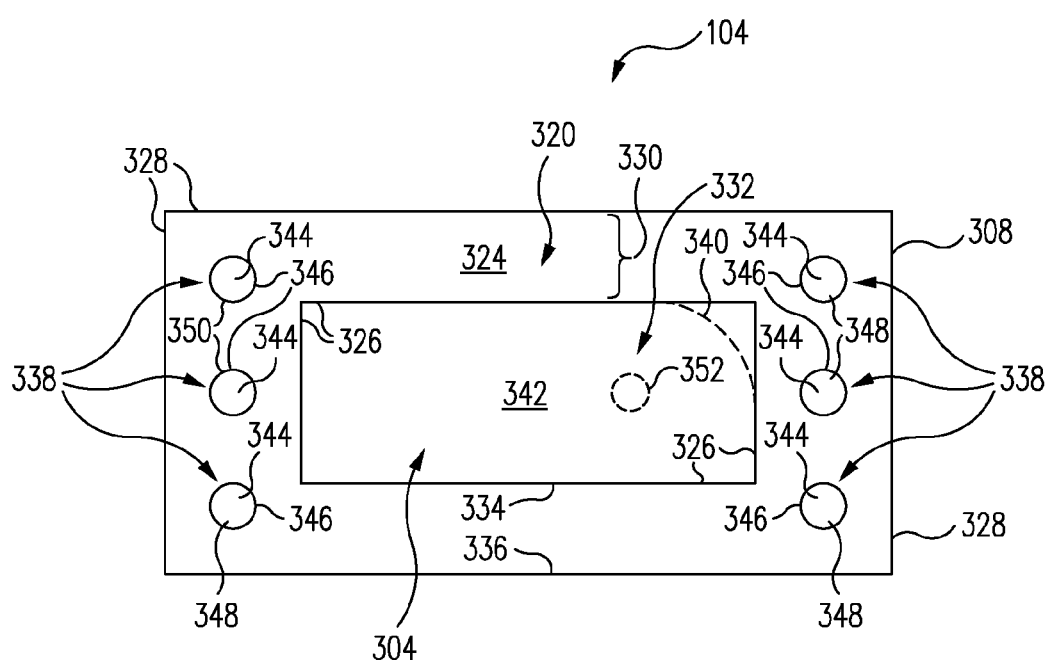
FIG. 3 is a top plan view taken from the direction of arrow III in FIG. 1 of a molded cavity substrate of the molded cavity substrate MEMS package in accordance with one embodiment.

Molded cavity substrate MEMS package 100 further includes molded cavity substrate 104. FIG. 3 is a top plan view taken from the direction of arrow III in FIG. 1 of molded cavity substrate 104 of molded cavity substrate MEMS package 100 in accordance with one embodiment.

Referring now to FIGS. 1, 2, and 3 together, molded cavity substrate 104 includes a substrate 302. Substrate 302 of molded cavity substrate 104 is sometimes called a first substrate and substrate 202 of base assembly 102 is sometimes called a second substrate.

Substrate 302 includes a dielectric material such as laminate, ceramic, printed circuit board material, or other dielectric material. Substrate 302 includes an inner surface 304, an opposite outer surface 306, and sides 308.

Substrate 302 further includes inner terminals 310 formed at inner surface 304. Further, substrate 302 includes outer traces 312 at outer surface 306. Inner terminals 310 are electrically connected to outer traces 312 by electrically conductive vias 314 extending through substrate 302 between inner surface 304 and outer surface 306.

Outer traces 312 include lands 316. In one embodiment, lands 316 are distributed in an array thus forming a Land Grid Array (LGA). Alternatively, interconnection balls 318, e.g., solder balls, are formed on lands 316 thus forming a Ball Grid Array (BGA). Interconnection balls 318 or, alternatively, lands 316 are used to electrically connect molded cavity substrate MEMS package 100 to a larger substrate such as a printed circuit mother board.

Substrate 302 can further include solder masks at inner and/or outer surfaces 304, 306, e.g., that protect first portions of outer traces 312 while exposing second portions, e.g., lands 316, of outer traces 312 and exposing inner terminals 310.

Although a particular electrically conductive pathway is described above, other electrically conductive pathways can be formed. For example, contact metallizations can be formed between the various electrical conductors.

Further, instead of straight though vias 314, in one embodiment, substrate 302 is a multilayer substrate and a plurality of vias and/or internal traces form the electrical interconnection between inner terminals 310 and outer traces 312.

Molded cavity substrate 104 further includes a molded ring 320. Molded ring 320 is a cured liquid encapsulant, molding compound, or other dielectric material. In one embodiment, molded ring 320 is formed by molding a dielectric material on inner surface 304 of substrate 302.

Molded ring 320 includes a substrate surface 322, a principal surface 324, inner sidewalls 326, and outer sidewalls 328. Substrate surface 322 is parallel to principal surface 324. Inner and outer sidewalls 326, 328 extend perpendicularly between substrate surface 322 and principal surface 324.

Although the terms parallel, perpendicular, and similar terms are used herein, it is to be understood that the described features may not be exactly parallel and perpendicular, but only substantially parallel and perpendicular to within accepted manufacturing tolerances.

Substrate surface 322 directly adheres to inner surface 304 of substrate 302. Illustratively, molded ring 320 is molded directly to inner surface 304 of substrate 302 such that substrate surface 322 is parallel to and coplanar with inner surface 304 of substrate 302. In one embodiment, substrate surface 322 is identical in shape to principal surface 324 as described in detail below.

More particularly, substrate surface 322 directly adheres to an outer peripheral region 330 of inner surface 304 of substrate 302 while exposing a central region 332 of inner surface 304 of substrate 302.

Principal surface 324 is an annular surface in accordance with this embodiment. Principal surface 324 is defined by an inner edge 334 and an outer edge 336 of principal surface 324. In one embodiment, inner edge 334 and outer edge 336 are rectangular in the top plan view, i.e., in the view of FIG. 3.

However, in other embodiments, inner edge 334 and/or outer edge 336 can have shapes other than rectangular. For example, to increase the surface area of principal surface 324 to allow more through vias 338 to be formed in molded ring 320, inner edge 334 can have one or more rounded corners 340 as indicated by the dashed line in FIG. 3.

Molded ring 320 includes a molded cavity 342. More particularly, the exposed central region 332 of inner surface 304 of substrate 302 and inner sidewalls 326 define molded cavity 342 of molded cavity substrate 104.

As set forth above, molded ring 320 is formed by molding a dielectric material directly upon substrate 302. As molding is a relatively simple and low cost process, molded ring 320 and thus molded cavity 342 are formed at a minimal cost. This, in turn, minimizes the cost of molded cavity substrate MEMS package 100.

Molded cavity substrate 104 further includes electrically conductive through vias 338. Through vias 338 extend through molded ring 320 between substrate surface 322 and principal surface 324. More particularly, through vias 338 are formed on inner terminals 310 and extend perpendicularly upward from inner terminals 310 through molded ring 320.

In one embodiment, the exposed outer via surfaces 344 of through vias 338 are recessed below principal surface 324. Illustratively, through vias 338 are formed of pre-attached solder balls on inner terminals 310. The pre-attached solder balls are overmolded by molded ring 320 to completely cover the pre-attached solder balls. Via apertures 346 are formed in principal surface 324, e.g., by laser-ablation, to expose the pre-attached solder balls, which thus form through vias 338.

However, in other embodiments, through vias 338 are formed using other through via formation techniques. For example, via apertures are formed in molded ring 320 to expose inner terminals 310. These via apertures are filled with an electrically conductive material, e.g., solder, electrically conductive adhesive, or other electrically conductive material, to form through vias 338. In various embodiments, exposed outer via surfaces 344 of through vias 338 are recessed below or protrude above principal surface 324.

In yet another embodiment, exposed outer via surfaces 344 of through vias 338 are parallel to and coplanar with principal surface 324. Illustratively, through vias 338 are formed of pre-attached solder balls on inner terminals 310. The pre-attached solder balls are overmolded by molded ring 320 to completely cover the pre-attached solder balls. Molded ring 320 may be ground down from principal surface 324 to expose the pre-attached solder balls, which thus form through vias 338 having exposed outer via surfaces 344 parallel to and coplanar with principal surface 324.

In accordance with the illustrated embodiment, through vias 338 include one or more ground vias 348 and one or more MEMS vias 350, sometimes called MEMS signal vias 350. More particularly, ground vias 348 and MEMS vias 350 are identical in structure, i.e., are first and second sets of through vias 338. However ground vias 348 are electrically connected to ground plane 214 of base assembly 102 as discussed further below. In contrast, MEMS vias 350 are connected to MEMS electronic component 222 and/or to converter electronic component 238 of base assembly 102.

As illustrated in FIG. 1, inner surface 204 of substrate 202 of base assembly 102 is mounted to principal surface 324 of molded ring 320 of molded cavity substrate 104 such that ground vias 348 are aligned with ground terminals 212 and MEMS vias 350 are aligned with MEMS terminals 220 of inner traces 210.

As illustrated in FIGS. 1 and 2, ground vias 348 are electrically connected to ground terminals 212 by base assembly mounting adhesive 106. In one embodiment, base assembly mounting adhesive 106 is electrically conductive adhesive, although can be other electrically conductive materials such as solder or paste.

In one embodiment, base assembly mounting adhesive 106 electrically connects ground vias 348 to ground terminals 212 in a many to many relationship. More particularly, all of ground vias 348 are electrically connected to all of ground terminals 212 by base assembly mounting adhesive 106. For example, base assembly mounting adhesive 106 seals the entire outer periphery 254 of inner surface 204 to the entire principal surface 324 of molded ring 320 while at the same time electrically connecting ground vias 348 to ground terminals 212.

During operation, the respective interconnection balls 318 connected to ground plane 214 are electrically connected to a reference voltage source, e.g., ground. More particularly, the reference voltage source is coupled from the respective interconnection balls 318 through the respective lands 316, outer traces 312, vias 314, inner terminals 310, ground vias 348, base assembly mounting adhesive 106, ground terminals 212, vias 216, and to ground plane 214.

Ground plane 214 is formed of an electrically conductive material to provide Radio Frequency (RF) shielding or more generally to provide shielding from ElectroMagnetic Interference (EMI). For example, when MEMS electronic component 222 is a silicon (Si) microphone, ground plane 214 shields MEMS electronic component 222 from EMI.

However, in another embodiment where shielding is unnecessary, molded cavity substrate MEMS package 100 is formed without ground plane 214 and without the respective interconnection balls 318, lands 316, outer traces 312, vias 314, inner terminals 310, ground vias 348, base assembly mounting adhesive 106, ground terminals 212, and vias 216. For example, MEMS electronic component 222 is an optical MEMS or pressure sensor that does not require shielding and so ground plane 214 and the associated conductors are not formed. In accordance with this embodiment, base assembly mounting adhesive 106 can be either a dielectric or conductive material.

In another embodiment, MEMS electronic component 222, sometimes referred to as an electronic component 222, is a MEMS or non-MEMS sensor that benefits from the low stress cavity environment provided by embodiments as described herein.

Referring again to the embodiment illustrated in FIGS. 1, 2, and 3, base assembly mounting adhesive 106 and thus ground plane 214 is electrically isolated from inner traces 210. More particularly, base assembly mounting adhesive 106 is patterned around MEMS terminals 220 to avoid contact and electrical interconnection (shorting) therewith.

MEMS vias 350 are electrically connected to MEMS terminals 220 by MEMS via interconnect material 256. In one embodiment, MEMS via interconnect material 256 is electrically conductive adhesive, although can be other electrically conductive materials such as solder.

In one embodiment, MEMS via interconnect material 256 electrically connects MEMS vias 350 to MEMS terminals 220 in a one to one relationship. More particularly, each MEMS via 350 is electrically connected to a respective MEMS terminal 220 by a respective MEMS via interconnect material 256.

During operation, signals are propagated to/from the respective interconnection balls 318 and to bond pads 232 of MEMS electronic component 222 and/or to bond pads 246 of converter electronic component 238. More particularly, signals are propagated to/from the respective interconnection balls 318 through the respective lands 316, outer traces 312, vias 314, inner terminals 310, MEMS vias 350, MEMS via interconnection materials 256, MEMS terminals 220, inner traces 210, bond fingers 218, bond wires 248 and/or bond wires 250, and to bond pads 232 of MEMS electronic component 222 and/or to bond pads 246 of converter electronic component 238.

As set forth above, base assembly mounting adhesive 106 seals the entire outer periphery 254 of inner surface 204 to the entire principal surface 324 of molded ring 320. Accordingly, molded cavity 342 of molded cavity substrate 104 is sealed by base assembly 102 and base assembly mounting adhesive 106.

MEMS electronic component 222 and converter electronic component 238 are located within molded cavity 342. As set forth above, in one embodiment, base assembly port 252 extends through substrate 202 to backplate 234 and generally to aperture 236 of MEMS electronic component 222. In accordance with this embodiment, molded cavity 342 defines a back volume.

In another embodiment, instead of providing base assembly port 252, a molded cavity substrate port 352 is formed in molded cavity substrate 104. More particularly, molded cavity substrate port 352 is an aperture, sometimes called an opening or hole, extending through substrate 302 between outer surface 306 and inner surface 304. Molded cavity substrate port 352 extends through substrate 302 to molded cavity 342.

Molded cavity substrate port 352 is in fluid communication with molded cavity 342 and thus with diaphragm 230 of MEMS electronic component 222. In accordance with this embodiment, aperture 236 of MEMS electronic component 222 defines a back volume.

In accordance with another embodiment, molded cavity substrate MEMS package 100 includes both base assembly port 252 and molded cavity substrate port 352. For example, MEMS electronic component 222 is a differential or gauge pressure sensor that senses the difference in pressure at base assembly port 252 and molded cavity substrate port 352.

In accordance with another embodiment, molded cavity substrate MEMS package 100 does not include either base assembly port 252 or molded cavity substrate port 352. For example, MEMS electronic component 222 does not need to be in fluid communication with the ambient environment. For example MEMS electronic component 222 is a gyroscope (gyro), accelerometer, a stress sensitive device, and/or combinations thereof, e.g., includes single or multiple MEMS dies sealed within molded cavity 342.

As illustrated in FIG. 1, sides 208 of substrate 202, outer sidewalls 328 of molded ring 320, and sides 308 of substrate 302 are parallel to and coplanar with one another. Illustratively, molded cavity substrate MEMS package 100 is formed simultaneously with a plurality of packages in an array or strip. The array or strip is singulated resulting in sides 208, outer sidewalls 328, and sides 308 being parallel to and coplanar with one another.

Figure 4:
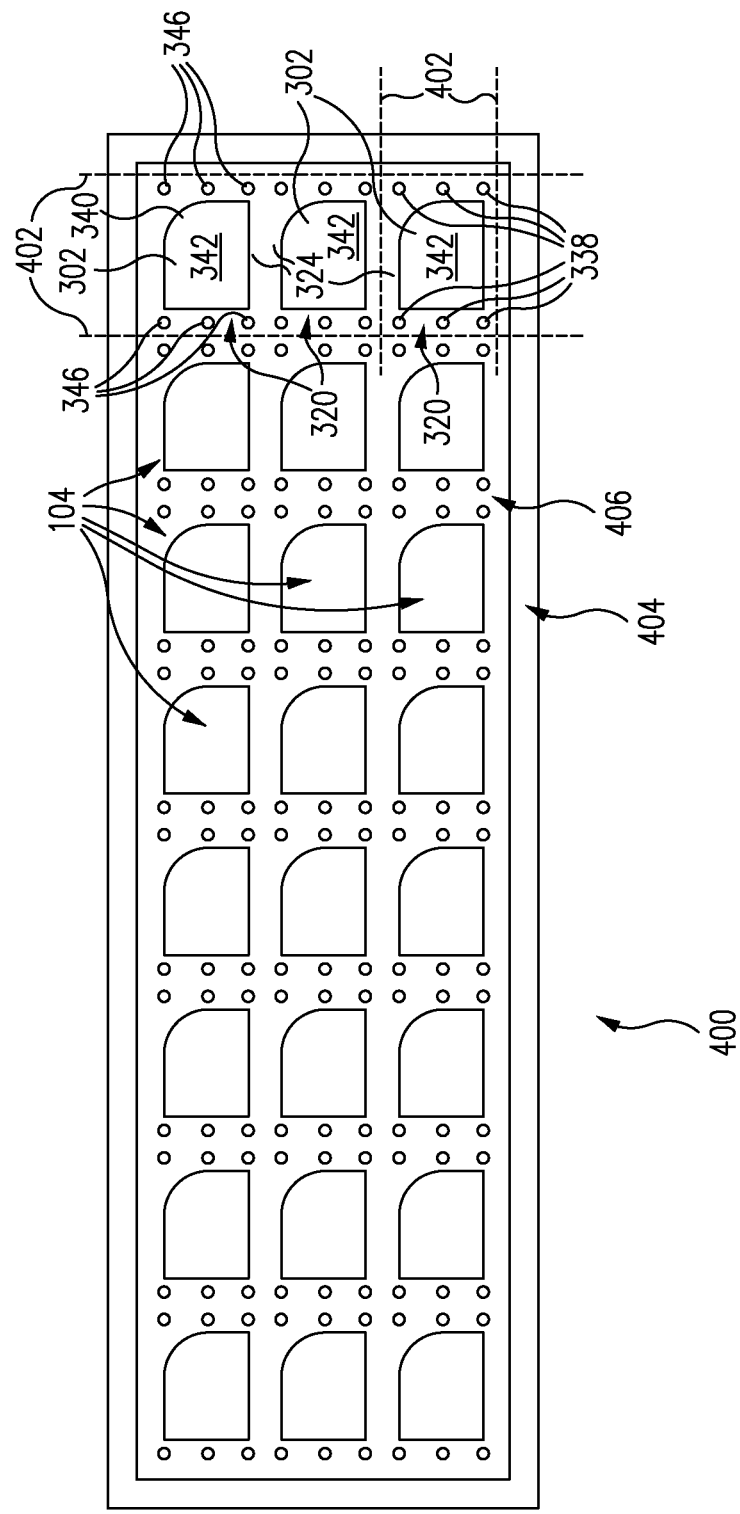
FIG. 4 is a top plan view of a molded cavity substrate array of molded cavity substrates in accordance with one embodiment.

FIG. 4 is a top plan view of a molded cavity substrate array 400 of molded cavity substrates 104 in accordance with one embodiment. Referring now to FIGS. 1 and 4 together, molded cavity substrates 104 are integrally connected together within molded cavity substrate array 400. Molded cavity substrates 104 are delineated from one another by singulation streets 402.

In one embodiment, to form molded cavity substrate array 400, a substrate array 404 of substrates 302 integrally connected together is provided. Pre-attached solder balls are formed on inner terminals 310 of substrates 302. The pre-attached solder balls are overmolded by a molded ring array 406 of molded rings 320 to completely cover the pre-attached solder balls. Via apertures 346 are formed in molded rings 320, e.g., by laser-ablation, to expose the pre-attached solder balls, which thus form through vias 338.

However, in other embodiments, through vias 338 are formed using other through via formation techniques. For example, via apertures are formed in molded rings 320 to expose inner terminals 310 of substrates 302. The via apertures are filled with an electrically conductive material, e.g., solder, electrically conductive adhesive, or other electrically conductive material, to form through vias 338.

In yet another embodiment, pre-attached solder balls are formed on inner terminals 310 of substrates 302. The pre-attached solder balls are overmolded by molded ring array 406 of molded rings 320 to completely cover the pre-attached solder balls. Molded ring array 406 including molded rings 320 are ground down from principal surfaces 324 to expose the pre-attached solder balls, which thus form through vias 338.

After fabrication of molded cavity substrate array 400 as discussed above, a base assembly 102 is attached to each molded ring 320 in a manner similar to that described above. In one embodiment, a base assembly array including a plurality of base assemblies 102 is attached to molded cavity substrate array 400. The resulting assembly is then singulated along singulation streets 402 resulting in a plurality of individual molded cavity substrate MEMS packages 100.

In another embodiment, individual base assemblies 102 are mounted one at a time to each molded ring 320 of molded cavity substrate 400. The resulting assembly is then singulated along singulation streets 402 resulting in a plurality of individual molded cavity substrate MEMS packages 100.

In yet another embodiment, molded cavity substrate MEMS packages 100 are fabricated individually. For example, molded cavity substrate 400 is singulated to form a plurality of individual molded cavity substrates 104. Alternatively, molded cavity substrates 104 are formed individually, e.g., by molding a molded ring 320 upon an individual substrate 302. In either embodiment, a base assembly 102 is mounted individually to an individual molded cavity substrate 104.

Figure 5:
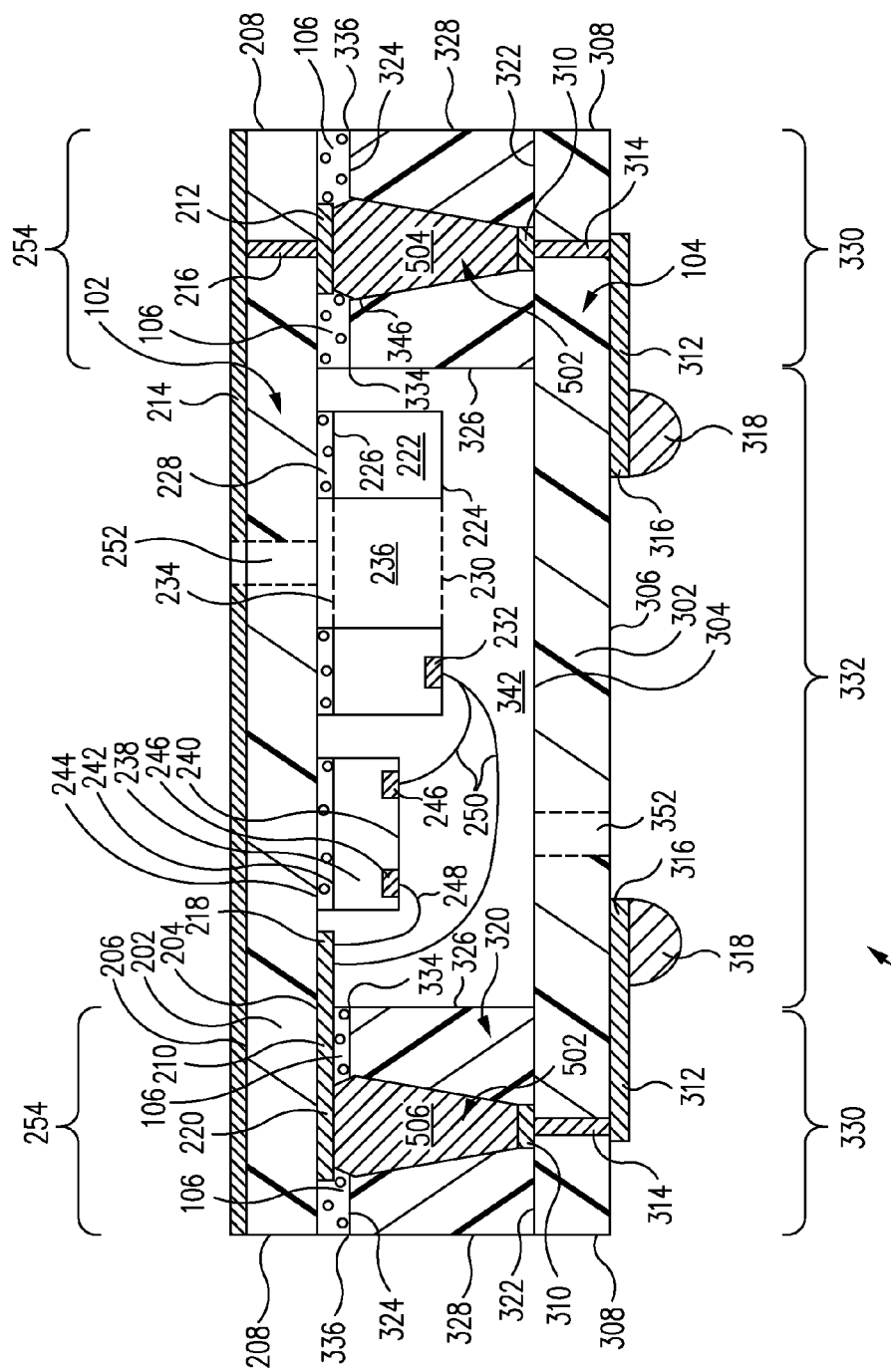
FIGS. 5, 6, 7 are cross-sectional views of molded cavity substrate MEMS packages in accordance with various embodiments.

FIG. 5 is a cross-sectional view of a molded cavity substrate MEMS package 500 in accordance with one embodiment. Molded cavity substrate MEMS package 500 of FIG. 5 is similar to molded cavity substrate MEMS package 100 of FIG. 1 and only the significant differences are described below.

Referring now to FIG. 5, in accordance with this embodiment, inner terminals 310 are electrically and physically connected to MEMS terminals 220 and ground terminals 212 by electrically conductive solder columns 502. Solder columns 502 extend from inner terminals 310, through molded ring 220, and to MEMS terminals 220 and ground terminals 212. Inner terminals 310 are electrically connected in a one to one relationship to MEMS terminals 220 and ground terminals 212 by solder columns 502.

For example, referring now to FIGS. 1 and 5 together, solder balls (not shown) are formed on MEMS terminals 220 and ground terminals 212. These solder balls are placed within via apertures 346 of molded ring 320 and on outer via surfaces 344 of through vias 338 (via apertures 346, outer via surfaces 344, and through vias 338 are illustrated in FIG. 1). The assembly is then heated to reflow, i.e., heat to a melt and then cool to resolidify, these solder balls and through vias 338 to collectively form solder columns 502 as illustrated in FIG. 5.

In accordance with this embodiment, solder columns 502 include one or more ground solder columns 504 and one or more MEMS solder columns 506. More particularly, ground solder columns 504 and MEMS solder columns 506 are identical in structure, i.e., are first and second sets of solder columns 502. However ground solder columns 504 are electrically connected to ground plane 214 of base assembly 102. In contrast, MEMS solder columns 506 are connected to MEMS electronic component 222 and/or converter electronic component 238 of base assembly 102.

Base assembly mounting adhesive 106, e.g., an underfill type dielectric material, surrounds and protects solder columns 502 in one embodiment.

Figure 6:
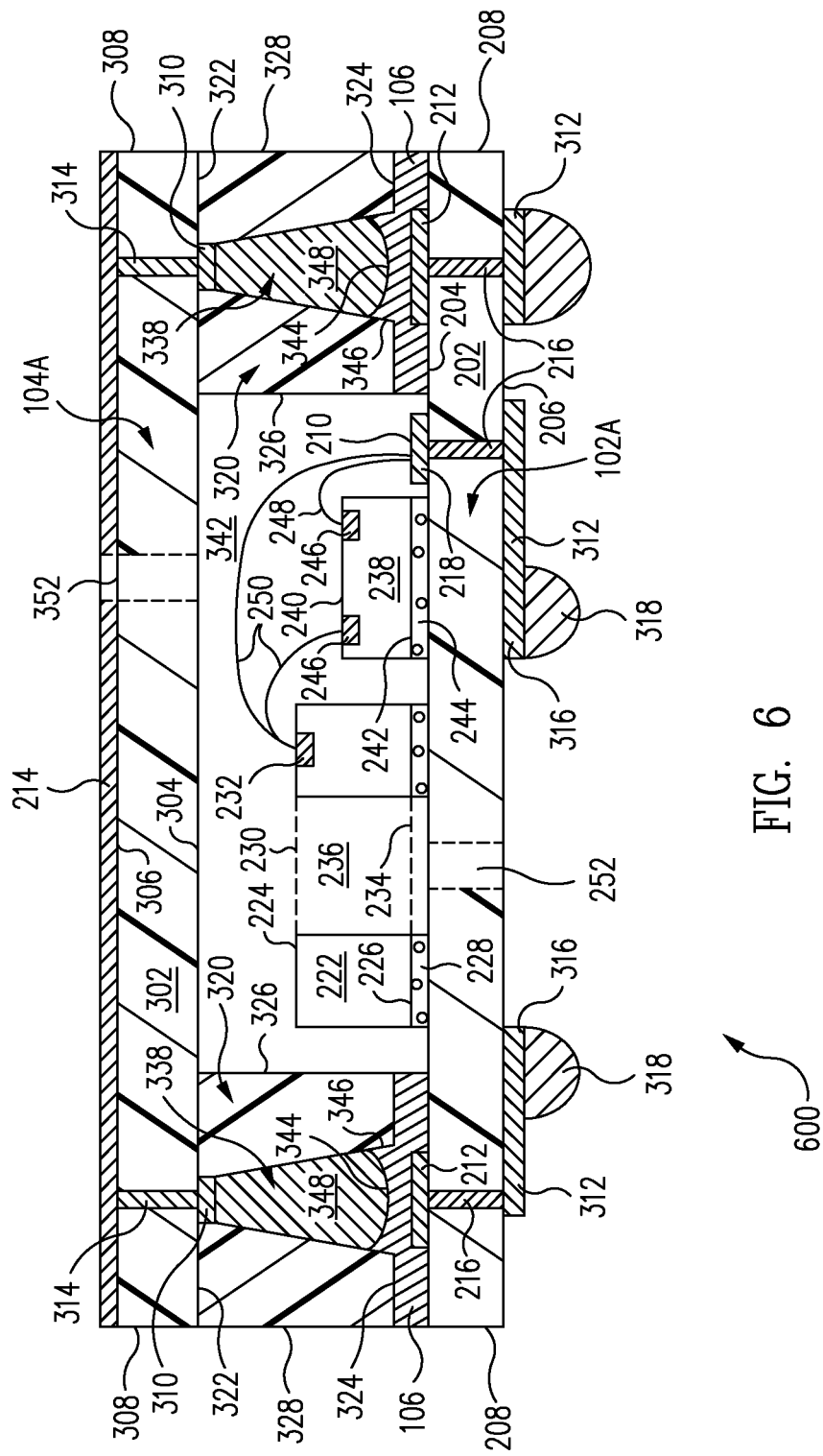

FIG. 6 is a cross-sectional view of a molded cavity substrate MEMS package 600 in accordance with one embodiment. Molded cavity substrate MEMS package 600 of FIG. 6 is similar to molded cavity substrate MEMS package 100 of FIG. 1 and only the significant differences are described below.

Referring now to FIG. 6, in accordance with this embodiment, ground plane 214 is formed on outer surface 306 of substrate 302 of a molded cavity substrate 104A. Further, outer traces 312 are formed on outer surface 206 of substrate 202 of a base assembly 102A.

Ground plane 214 is electrically connected to vias 314, inner terminals 310, and ground vias 348. Note that all the electrically conductive through vias 338 that extend through molded ring 320 in accordance with this embodiment are electrically connected to ground plane 214 and thus are referred to as ground vias 348.

Outer traces 312 are electrically connected to vias 216 and inner traces 210. Outer traces 312 are also electrically connected to vias 216 and ground terminals 212. Ground terminals 212 are electrically connected to exposed outer via surfaces 344 of ground vias 348 by base assembly mounting adhesive 106. However, in another embodiment, inner terminals 310 are directly connected to ground terminals 212 by solder columns similar to solder columns 502 of molded cavity substrate MEMS package 500 of FIG. 5 as described above.

Figure 7:
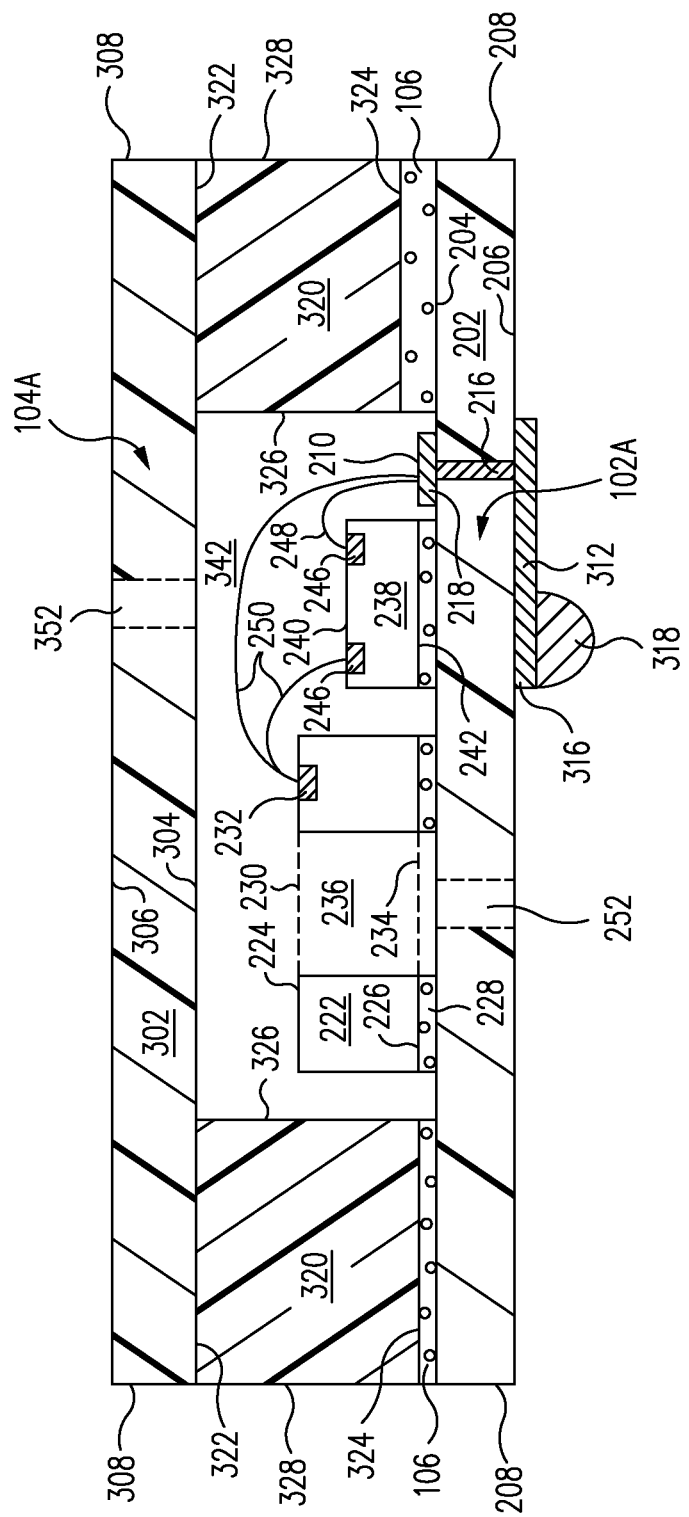

FIG. 7 is a cross-sectional view of a molded cavity substrate MEMS package 700 in accordance with one embodiment. Molded cavity substrate MEMS package 700 of FIG. 7 is similar to molded cavity substrate MEMS package 600 of FIG. 6 and only the significant differences are described below. More particularly, molded cavity substrate MEMS package 700 is formed without ground plane 214 and the associated conductors of molded cavity substrate MEMS package 600. Accordingly, outer traces 312 are connected only to inner traces 210 by vias 216.

Referring now to FIG. 7, molded ring 320 has an absence of through vias or other electrically conductive structures. Principal surface 324 of molded ring 320 is attached to inner surface 204 of substrate 202 by base assembly mounting adhesive 106.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. An electronic component package comprising:
   a Micro Electro Mechanical Systems (MEMS) electronic component;
   a base substrate comprising an inner surface, an outer surface, and a first conductive path extending from the inner surface to the outer surface;
   a molded ring coupled to the base substrate, the molded ring comprising a top side, a bottom side, a second conductive path extending from the top side to the bottom side, and a molded cavity, the MEMS electronic component being located within the molded cavity; and
   a lid coupled to the molded ring, the lid comprising a metal layer.

2. The electronic component package of claim 1, wherein the base substrate comprises a laminate substrate.

3. The electronic component package of claim 1, wherein the lid comprises a cavity port.

4. The electronic component package of claim 1, wherein the lid comprises a dielectric material.

5. The electronic component package of claim 4, wherein the dielectric material comprises mold material.

6. The electronic component package of claim 4, wherein the dielectric material and metal layer of the lid comprise a molded cavity substrate.

7. The electronic component package of claim 1, wherein the molded ring comprises:
   mold compound directly adherent to an outer peripheral region of the inner surface of the base substrate, with a central region of the inner surface of the base substrate exposed by the molded ring.

8. The electronic component package of claim 1, wherein the metal layer comprises a ground plane; and
   at least one of the first or second conductive paths comprise a through via.

9. The electronic component package of claim 1, wherein the metal layer is electrically coupled to the second conductive path.

10. The electronic component package of claim 1, wherein an aperture extends through the base substrate.

11. An electronic component package comprising:
    a package top lid comprising a metal layer and dielectric material;
    package sidewalls comprising mold material and forming a molded ring;
    a base substrate comprising an inner surface coupled to the molded ring, the base substrate further comprising an inner trace coupled to the inner surface and an outer trace coupled to an outer surface of the base substrate; and
    a Micro Electro Mechanical Systems (MEMS) electronic component located within a cavity defined the molded ring.

12. The electronic component package of claim 11, wherein the dielectric material comprises mold material.

13. The electronic component package of 11, wherein a conductive via extends through the molded ring.

14. The electronic component package of claim 13, wherein the conductive via is electrically coupled to the metal layer in the package top lid.

15. The electronic component package of claim 11, wherein the metal layer in the package top lid comprises a ground plane.

16. The electronic component package of claim 11, wherein an electronic component is coupled to the MEMS electronic component and located within the molded ring.

17. The electronic component package of claim 11, wherein the MEMS electronic component is electrically coupled to the inner trace.

18. The electronic component package of claim 11, wherein an aperture extends through the base substrate.

19. The electronic component package of claim 11, wherein the package top lid comprises a cavity port.

20. A method of manufacturing an electronic component package, the method comprising:
- molding a dielectric material on a base substrate to form a molded ring, the molded ring comprising a conductive through via and a molded cavity;
- providing a Micro Electro Mechanical Systems (MEMS) electronic component within the molded cavity; and
- providing a package lid comprising a metal layer, the package lid coupled to the molded ring and the metal layer coupled to the conductive through via.

* * * * *